United States Patent
Park et al.

(10) Patent No.: US 7,591,568 B2
(45) Date of Patent: Sep. 22, 2009

(54) POINT LIGHT SOURCE, BACKLIGHT ASSEMBLY HAVING THE SAME AND DISPLAY APPARATUS HAVING THE SAME

(75) Inventors: Se-Ki Park, Suwon-si (KR); Seok-Hyun Nam, Seoul (KR); Byung-Choon Yang, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 273 days.

(21) Appl. No.: 11/668,832

(22) Filed: Jan. 30, 2007

(65) Prior Publication Data

US 2008/0025044 A1 Jan. 31, 2008

(30) Foreign Application Priority Data

Feb. 9, 2006 (KR) .................. 10-2006-0012706

(51) Int. Cl.
*F21V 33/00* (2006.01)
(52) U.S. Cl. .................. 362/311; 362/308; 362/310; 362/327; 362/341; 362/800; 362/555
(58) Field of Classification Search .................. 362/800, 362/326, 327, 334, 341, 346, 297, 299–302, 362/307, 308, 310, 311, 545, 555, 612

See application file for complete search history.

(56) References Cited

U.S. PATENT DOCUMENTS

| 3,774,021 | A  | * | 11/1973 | Johnson ...................... 362/27 |
| 7,021,805 | B2 | * | 4/2006  | Amano et al. ............... 362/518 |
| 7,073,931 | B2 | * | 7/2006  | Ishida ......................... 362/539 |
| 2006/0018122 | A1 | * | 1/2006 | Negley ........................ 362/326 |

FOREIGN PATENT DOCUMENTS

| JP | 2001-308387 | 11/2001 |
| JP | 2004-288866 | 10/2004 |
| KR | 10-0454777  | 10/2004 |

* cited by examiner

*Primary Examiner*—Laura Tso
(74) *Attorney, Agent, or Firm*—F. Chau & Associates, LLC

(57) ABSTRACT

A point light source includes a light-emitting element, an optical lens, and at least two reflective members. The light-emitting element emits a point light. The optical lens is disposed over the light-emitting element. The reflective members are disposed in the optical lens. The reflective members confine an optical path of the light emitted from the light-emitting element, thereby substantially preventing the illumination areas of the point light sources from overlapping each other.

25 Claims, 19 Drawing Sheets

(a) 4mm (b) 4.4mm (c) 5mm (d) 6mm (a) 20mm (b) 40mm (c) 60mm (d) 80mm (a) 1mm (b) 2mm (c) 3mm (d) 4mm (a)-15.6°

(b)-5.7°

(d)0°

(d)5.7°

(e) 16.6°

(f) 30.9°

(g)50.2°

(h)63.4°

(a)−16.6°

(b)−5.7°

(c) 0°

(d) 5.7°

(e) 16.6°

(f) 30.9°

(g) 50.2°

(h) 63.4°

POINT LIGHT SOURCE, BACKLIGHT ASSEMBLY HAVING THE SAME AND DISPLAY APPARATUS HAVING THE SAME

CROSS-REFERENCE TO RELATED APPLICATIONS

This application claims the benefit of Korean Patent Application No. 2006-12706, filed on Feb. 9, 2006, the content of which is herein incorporated by reference in its entirety.

BACKGROUND OF THE INVENTION

1. Field of the Invention

The present invention relates to a point light source, a backlight assembly having the point light source and a display apparatus having the point light source. More particularly, the present invention relates to a point light source including a reflective member capable of controlling an illumination area, a backlight assembly having the point light source and a display apparatus having the point light source.

2. Description of Related Art

In a display apparatus using a light receiving type display element no light is generated. The display apparatus is implemented with a separate light source for providing light to the light receiving type display element. The light receiving type display element controls an optical transmissivity of the light from the light source in response to an electrical signal to thereby display an image having a desired gray scale. For a light receiving type display element using a white light source, a color filter is used to display a color. The color fitter reduces an optical transmissivity, complicates manufacturing processes and increases manufacturing cost.

Accordingly, attempts have been made to omit the color filter. Instead of the color filter, red, green and blue light sources may be employed in the light source of the light receiving type display element. The light sources are sequentially turned on and turned off. Data is applied to the display element in synchronization with turning the light sources on and off, to thereby display colors of an image. In a field sequential driving method of a liquid crystal display apparatus, a plurality of light source modules each having a plurality of red, green and blue (RGB) point light sources is disposed in a scanning area, and the RGB point light sources of each light source module are appropriately turned on in synchronization with scans of the liquid crystal display apparatus.

In the field sequential driving method, light providing areas of the light source modules overlap each other, and thus luminance is non-uniform. In addition, when light sources of a previously scanned light source module have a color different from that of light sources of a later scanned light source module, undesired color-mixing is generated and display quality is deteriorated.

Therefore, a need exists for a point light source including a reflective member capable of controlling an illumination area, a backlight assembly having the point light source and a display apparatus having the point light source

SUMMARY OF THE INVENTION

According to an embodiment of the present invention, a point light source includes a light-emitting element, an optical lens, and at least two reflective members. The light-emitting element emits a point light. The optical lens is disposed over the light-emitting element. The reflective members are disposed in the optical lens. The at least two reflective members may be disposed symmetrical to each other with respect to a light axis of the light-emitting element.

Each of the at least two reflective members may have a reflective surface inclined at an angle in a range of about −17 degrees to about 64 degrees with respect to the light axis of the light-emitting element. The optical lens may have a dome shape having a horizontal section of a substantially circular shape.

A ratio of a distance between the at least two reflective members to the horizontal section diameter of the optical lens may be in a range of about 0.6 to about 1.0, and may preferably be about 0.83.

A ratio of a width of the reflective members to the horizontal section diameter of the optical lens may be in a range of about 0.3 to about 1.2.

According to an embodiment of the present invention, a backlight assembly includes a plurality of point light sources. Each of the point light sources includes a light-emitting element emitting a point light, an optical lens disposed over the light-emitting element, and at least two reflective members disposed in the optical lens. The point light sources may include at least two point light sources having different optical wavelength ranges from each other.

The backlight assembly may include at least two point light source groups including at least one point light source each. Each of the point light source groups may include at least two point light sources having different optical wavelength ranges. Each of the point light source groups may include a plurality of point light sources having red, green and blue optical wavelength ranges.

According to an embodiment of the present invention, a display apparatus includes a display panel and a backlight assembly. The display panel includes a light receiving type display element. The backlight assembly includes a plurality of point light sources and provides light from the point light sources to the display panel. Each of the point light sources includes a light-emitting element emitting a point light, an optical lens disposed over the light-emitting element, and at least two reflective members disposed in the optical lens.

In an exemplary embodiment, the display panel includes display areas, the number of which is substantially the same as the number of the point light source groups, and the point light source groups provide light to corresponding display areas. Each of the point light source groups may include a plurality of point light sources having red, green and blue optical wavelength ranges. The point light source groups may be sequentially turned on and turned off. Two point light sources that define the same point light source group and have different optical wavelength ranges may be non-simultaneously turned on.

BRIEF DESCRIPTION OF THE DRAWINGS

The present invention will become more apparent by describing in detailed exemplary embodiments thereof with reference to the accompanying drawings, in which.

DETAILED DESCRIPTION OF PREFERRED EMBODIMENTS

Figure 1:
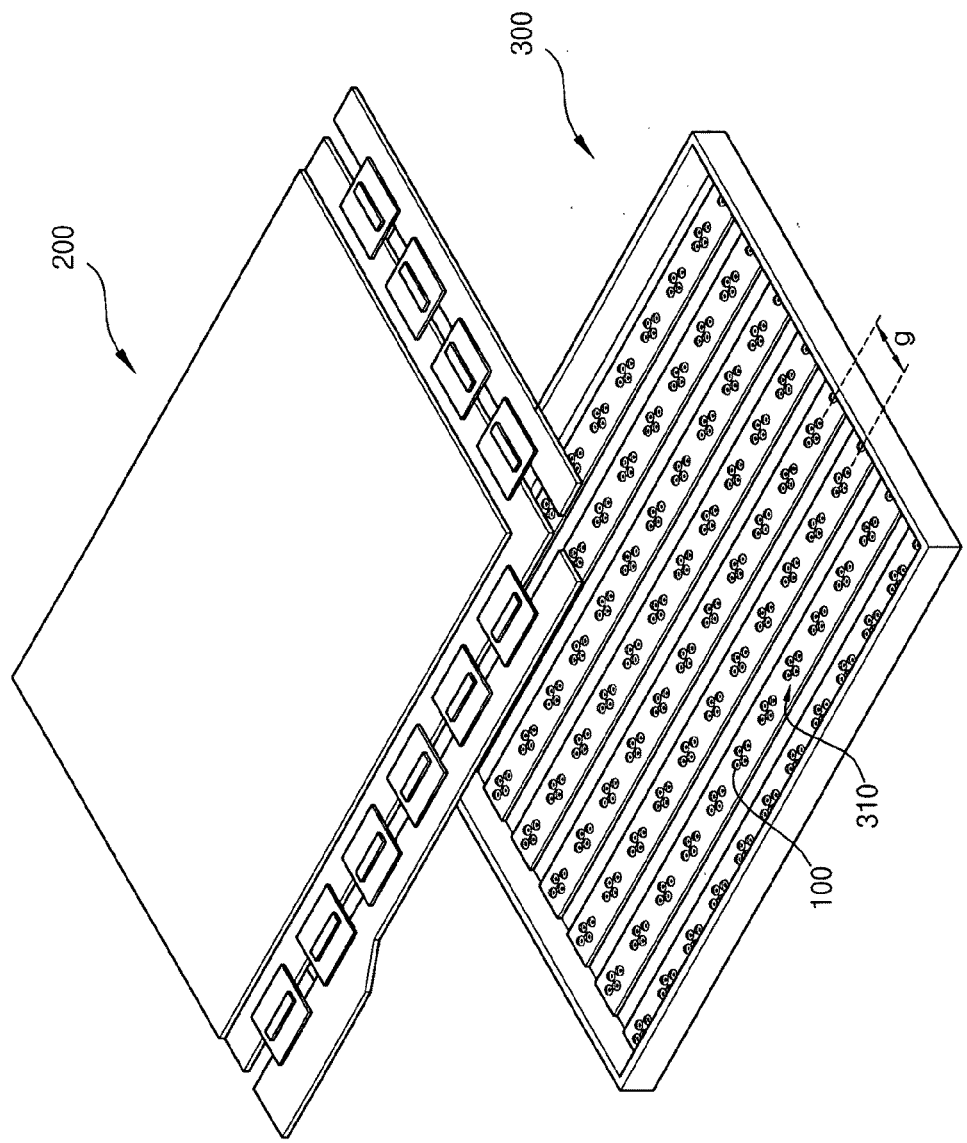
FIG. 1 is a perspective view illustrating a display apparatus according to an exemplary embodiment of the present invention.

The present invention now will be described more fully hereinafter with reference to the accompanying drawings, in which embodiments of the invention are shown. This invention may, however, be embodied in many different forms and should not be construed as limited to embodiments set forth herein; rather, embodiments are provided so that this disclosure will be thorough and complete, and will fully convey the scope of the invention to those skilled in the art. Like reference numerals refer to similar or identical elements throughout.

FIG. 1 is a perspective view illustrating a display apparatus according to an exemplary embodiment of the present invention.

Referring to FIG. 1, a display panel 200 includes a light receiving type display element. The light receiving type display element controls an optical transmissivity of light emitted from a light source included in a backlight assembly 300 in response to an electric signal to thereby display an image. A liquid crystal display element may serve as the light receiving type display element. In the liquid crystal display element, an electric field is applied to a liquid crystal layer disposed between two substrates to control an arrangement of liquid crystal molecules of the liquid crystal layer, thereby controlling a polarization state of light passing through the liquid crystal layer and thus obtaining a desired image.

The backlight assembly 300 is disposed at a rear side of the display panel 200 to provide light to the light receiving type display element. In an exemplary embodiment, the backlight assembly 300 includes a plurality of point light sources. A structure and a function of the point light sources will be described in detail later.

The backlight assembly 300 according to an exemplary embodiment of the present invention is illustrated in FIG. 1. The backlight assembly 300 includes a plurality of point light source groups 310 each having at least one point light source. Each of the point light source groups 310 may be disposed on a printed circuit board that is electrically connected to a driving circuit for controlling turn-on and turn-off of the point light source.

In an exemplary embodiment, the backlight assembly 300 includes at least two point light source groups 310 disposed at a regular interval.

Each of the point light source groups 310 includes at least one point light source, and includes, for example, at least two point light sources having different optical wavelength ranges from each other.

When the point light source group 310 includes at least two point light sources having different optical wavelength ranges, colors corresponding to the optical wavelength range of each point light source may be mixed to generate white light. For example, each of the point light source groups 310 includes at least one point light source having a red optical wavelength range, at least one point light source having a green optical wavelength range and at least one point light source having a blue optical wavelength range. Thus, each of the point light source groups 310 may include the point light sources having the red, green and blue optical wavelength ranges.

A display apparatus according to an exemplary embodiment of the present invention includes at least two point light source groups 310 having at least two point light sources having different optical wavelength ranges. Colors corresponding to the optical wavelength range of the point light source may be mixed to generate white light. For example, each point light source group 310 includes at least one red point light source, at least one green point light source and at least one blue point light source. The point light source group 310 may include a printed circuit board having a plurality of point light sources shown in FIG. 1.

According to an exemplary embodiment, an interval 'g' between the point light source groups 310 is in a range of about 40 mm to about 60 mm. The point light source group 310 provides light to an illumination area of the display panel 200, the illumination areas being independently set. The display apparatus according to an exemplary embodiment of the present invention includes at least eight rows of point light source groups 310, and the display panel 200 has eight rows of illumination areas corresponding to the eight rows of point light source groups 310. For example, when a display apparatus has 480 pixel rows, each point light source group 310 provides light to a predetermined area. More particularly, the 480 pixel rows are divided by the number of point light source groups 310, and each point light source group 310 provides light to eight pixel row groups each including at least 60 pixel rows. The illumination areas of the point light source groups 310 may overlap each other, and an overlapped portion varies with optical distribution of light emitted from the point light sources. For example, when a display apparatus having 480 pixel rows has eight point light source groups 310, a display area of the display apparatus is divided into eight pixel row groups each having 60 pixel rows, and each point light source group 310 illuminates light to a corresponding pixel row group. However, for example, when a substantial illumination area of each point light source group 310 corresponds to 50 pixel rows with respect to both upper and lower portions from a longitudinal central line of the point light source group 310, 20 pixel rows between two point light source groups 310 receive light from the two point light source groups 310. Thus, since the 20 pixel rows receiving the light from the two point light source groups 310 receive a larger amount of light than other pixel rows receiving light from only one point light source group 310, non-uniformity of luminance or color-mixing may be generated.

To substantially prevent such an overlap, a reflective member 110 is disposed in the point light source 100 to confine an optical path of the light emitted from the point light source 100, thereby substantially preventing non-uniformity of luminance or color-mixing associated with the overlap. The structure and function of the point light source 100 of the point light source group 310 will be described later.

Point light sources belonging to one point light source group 310, which have different optical wavelength ranges, are not simultaneously turned on. For example, the point light source group 310 includes a red point light source, a green point light source and a blue point light source, and when the red point light source is turned on, the green point light source and the blue point light source are not turned on.

Figure 2:
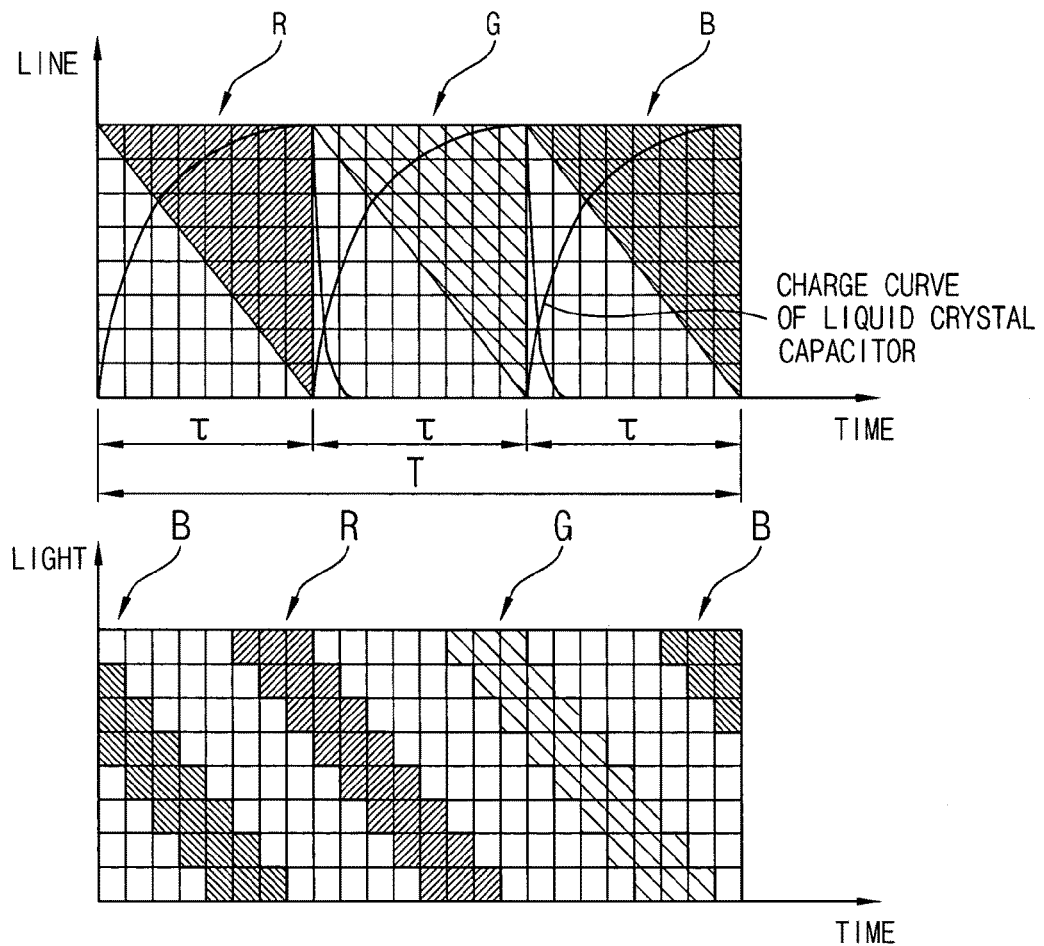
FIG. 2 is a timing diagram illustrating displaying one frame of an image of the display apparatus in FIG. 1.

FIG. 2 is a timing diagram illustrating displaying one frame of an image of the display apparatus in FIG. 1.

Referring to FIG. 2, when eight printed circuit boards (PCBs) are disposed in the backlight assembly 300 and the point light source groups 310 each including red, green and blue (RGB) light-emitting diodes (LEDs) are arranged on each of the PCBs, a display panel has a plurality of pixels and eight pixel row groups corresponding to the PCBs defined by equally dividing total pixel rows.

An operation of the display apparatus according to an exemplary embodiment will be described below.

One frame is divided into three sub-frames. Each sub-frame has a time for sequentially inputting the red, green and blue data to one pixel row of a display panel. For example, the red, green and blue data are input to first, second and third sub-frames, respectively.

Each row of the point light source groups 310 is turned on in synchronization with selection of the corresponding pixel row group. For example, when a first pixel row group is selected to initiate the first sub-frame, red data is input to the first pixel row group and point light sources of the first point light source group corresponding to the first pixel row group are turned on. After the selection of all the pixel rows of the first pixel row group is completed, pixel rows belonging to a second pixel row group are also selected and red data is input to the second pixel row group. Thus, point light sources of the second point light source group corresponding to the second pixel row group are turned on. Similar to the above, sequentially, red data is input to an eighth pixel row group and thus point light sources of the eighth point light source group corresponding to the eighth pixel row group are turned on. When data input of all the pixels belonging to the eighth pixel row group is completed, the first sub-frame is completed.

In the first sub-frame, only a red component of an image is displayed. Thus, only a red LED of each point light source group 310 is turned on, and green and blue LEDs of each point light source group 310 are not turned on. In the second sub-frame, input of green data and turn-on of a green LED are synchronously performed. In the third sub-frame, input of blue data and turn-on of a blue LED are synchronously performed. Such a display mechanism is repetitively performed in each frame.

Selection of the pixel row is sequentially performed for one vertical synchronizing period. Thus, turn-on timing of the point light source group 310 corresponding to each pixel row group may be determined by selection of a predetermined pixel row belonging to each pixel row group. For example, the point light source group 310 may be turned on in synchronization with selection of the tenth pixel row of each pixel row group.

According to an exemplary embodiment, in the first sub-frame, the point light source group 310 maintains a turn-on state for a latter ⅜ of the first sub-frame, and the point light source groups are sequentially turned on after an interval of ⅛ of the first sub-frame. In the second sub-frame, the green point light sources are turned on by the above method. In the third sub-frame, the blue point light sources are turned on by the above method. Thus, a light receiving type display element according to the present invention sequentially displays red, green and blue components, which form an image of one frame, in each sub-frame to thereby complete the image.

Thus, turn-on and turn-off of the point light source is controlled in synchronization with a data input period of pixel row included in each illumination area or each pixel row group. Therefore, a colored gray scale may be obtained using a light receiving type display element without a color filter.

Figure 3A:
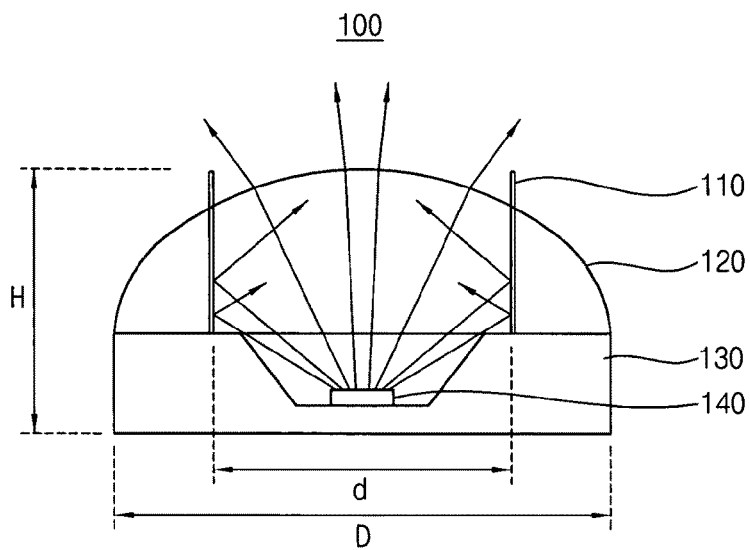
FIG. 3A is a front view illustrating a point light source according to an exemplary embodiment of the present invention.
Figure 3B:
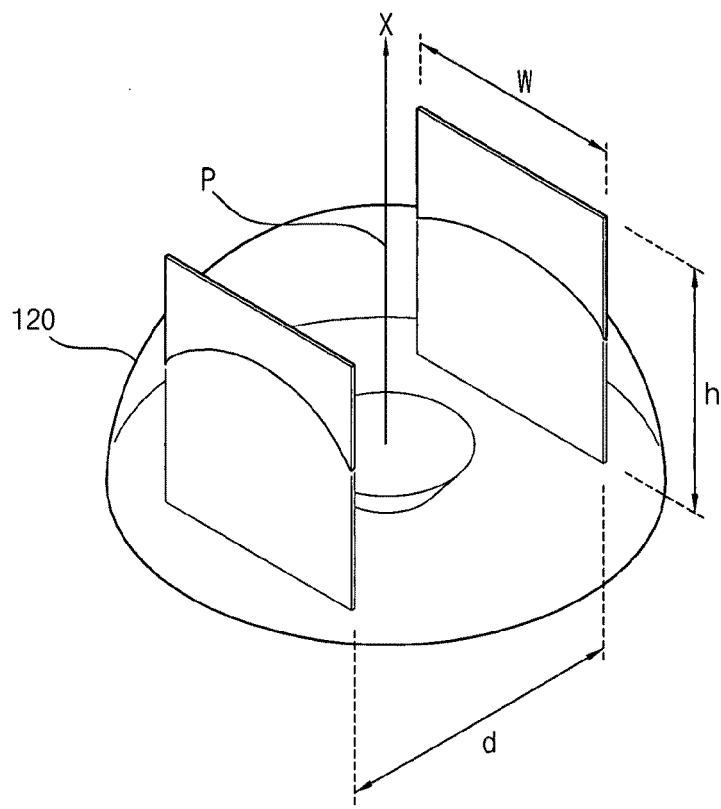
FIG. 3B is a perspective view illustrating the point light source illustrated in FIG. 3A.

FIG. 3A is a front view illustrating a point light source according to an exemplary embodiment of the present invention. FIG. 3B is a perspective view illustrating the point light source illustrated in FIG. 3A.

Referring to FIGS. 3A and 3B, the point light source 100 according to an exemplary embodiment includes a light-emitting element 140 emitting a point light, a mold 130 receiving the light-emitting element 140, an optical lens 120 coupled to the mold 130 to cover the light-emitting element 140, and at least two reflective members 110 disposed in the optical lens 120.

The light-emitting element 140 converts electrical signals into light. The light-emitting element 140 includes an LED.

The mold 130 includes a body of the point light source 100 formed of a resin. The mold 130 receives the light-emitting element 140 in the mold 130 and fastens the light-emitting element 140 to the mold 130.

The optical lens 120 is coupled to the mold 130 to cover the light-emitting element 140, and controls an optical path so that light emitted from the light-emitting element 140 progresses to a predetermined illumination area. The optical lens 120 may have a predetermined shape corresponding to a shape of illumination and an intensity of illumination. For example, the optical lens 120 has a convex shape corresponding to a portion of a sphere when the optical lens 120 is used for collecting light. According to an exemplary embodiment, as shown in FIGS. 3A and 3B, the optical lens 120 has a dome shape having a horizontal section of a substantially circular shape and a vertical section of a substantially circular arc shape.

The reflective member 110 is disposed in the optical lens 120 to reflect light that is incident onto the reflective member 110 and to confine an illumination area of the light-emitting element 140. At least two reflective members 110 may be disposed in the optical lens 120 to confine the illumination area of the light-emitting element 140 in at least two directions. The reflective member 110 may include a thin plate of metal. Alternatively, the reflective member 110 may include a thin plate of a resin on which white or silver color paint is coated. The reflective member 110 may have various shapes such as an angled line shape, a curved line shape, etc., as shown in FIGS. 4A to 4D.

The point light source 100 according to an exemplary embodiment includes at least a pair of reflective members 110 disposed symmetrical to each other with respect to a light axis 'X' of the light-emitting element 140. The reflective member 110 includes two reflective members 110 spaced apart from each other, and the two reflective members 110 are disposed symmetrical to each other with respect to the light axis 'X' of the light-emitting element 140. The light axis 'X' of the light-emitting element 140 represents a direction in which the light emitted from the light-emitting element 140 has a strongest luminous intensity. The axis 'X' typically corresponds to a normal direction to a plane on which the light-emitting element 140 is positioned.

The two reflective members 110 are spaced apart from each other by a predetermined distance 'd' to confine the illumination area of the point light source. As shown in FIG. 3A when 'D' is referenced to a horizontal section diameter of the optical lens 120 and 'd' is referenced to a distance between the two reflective members 110, a ratio 'd/D' of the distance between the two reflective members 110 and the horizontal section diameter of the optical lens 120 may be in a range of about 0.6 to about 1.0, and may preferably be about 0.83.

Figure 5:
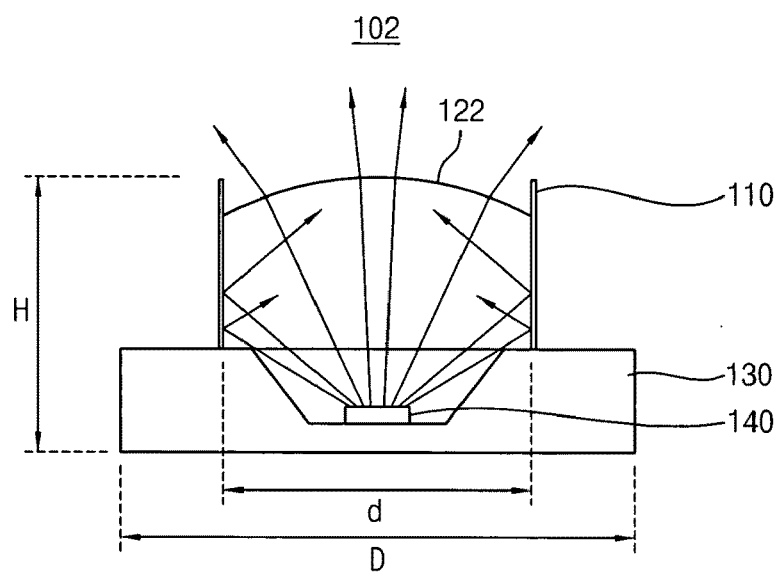
FIG. 5 is a front view illustrating a point light source according to another exemplary embodiment of the present invention.
Figure 6A:
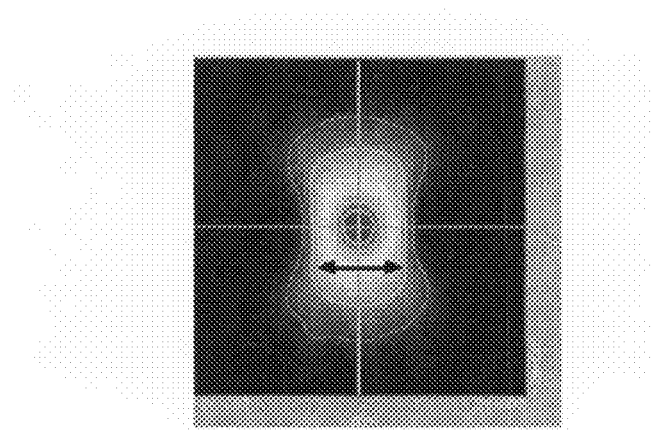
FIGS. 6A to 6D are graphs showing simulation results of luminance distribution of an illumination area related to a distance between the reflective members illustrated in FIGS. 3A and 3B.
Figure 6B:
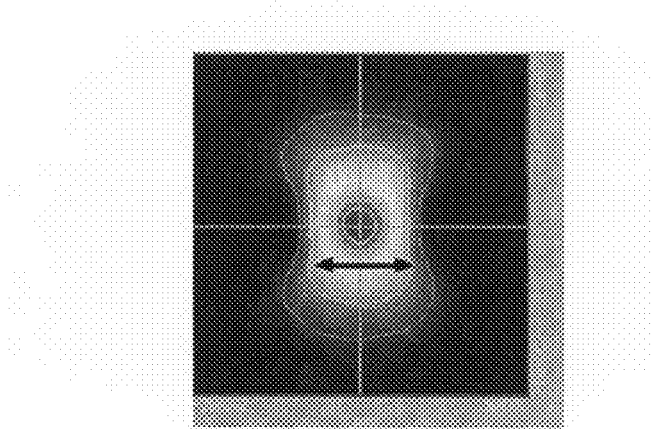
Figure 6C:
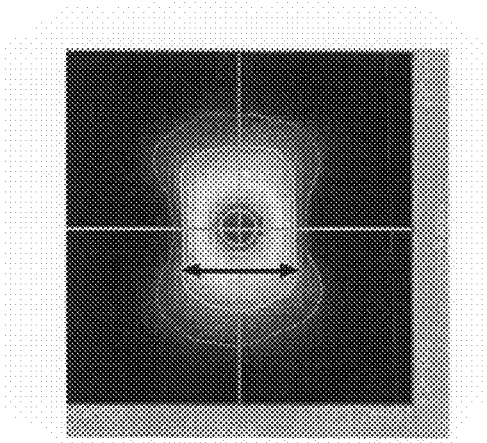
Figure 6D:
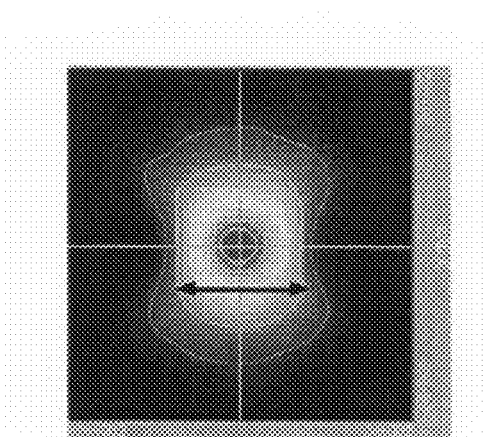
Figure 7A:
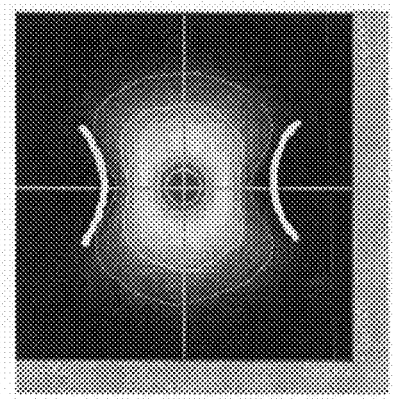
FIGS. 7A to 7D are graphs showing simulation results of luminance distribution of an illumination area related to a width of the reflective members illustrated in FIGS. 3A and 3B.
Figure 7B:
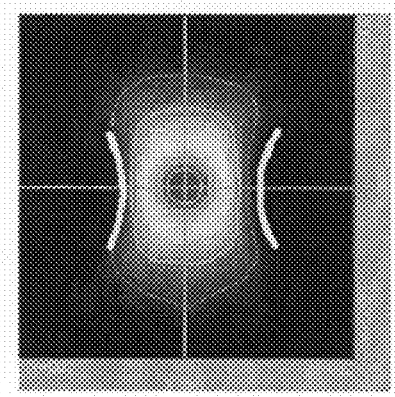
Figure 7C:
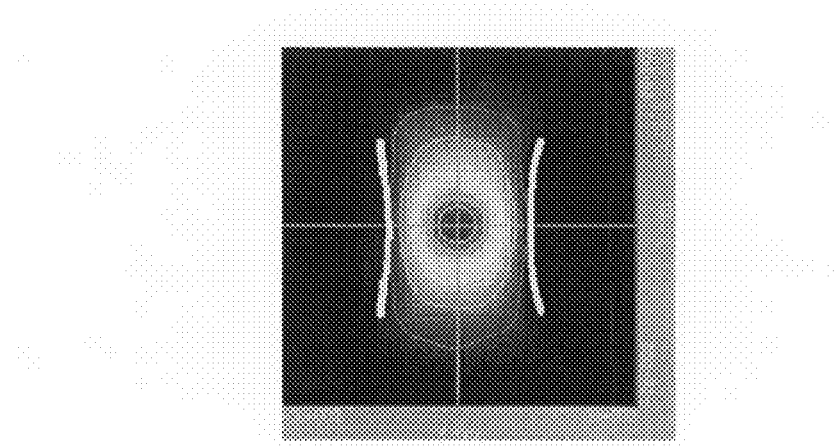
Figure 7D:
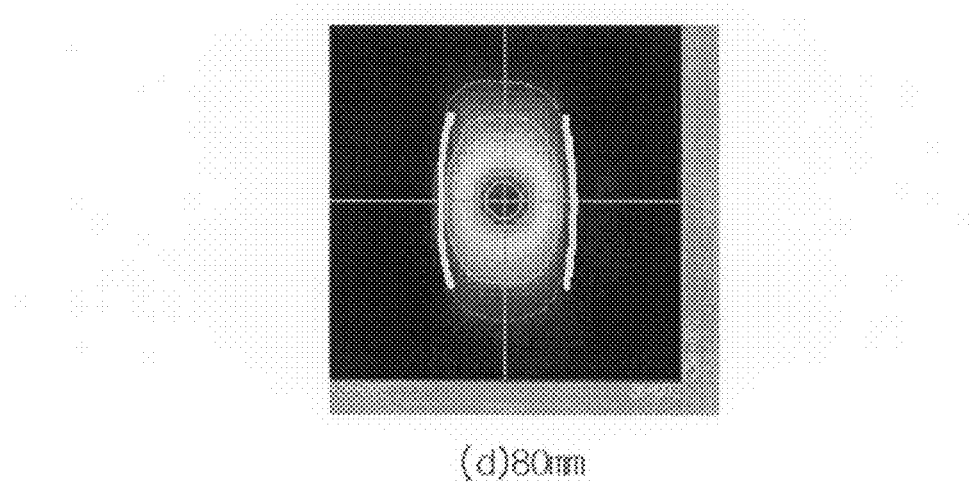

FIG. 5 is a front view illustrating a point light source according to another exemplary embodiment of the present invention.

Referring to FIG. 5, a point light source 102 includes a light-emitting element 140 emitting a point light, a mold 130 receiving the light-emitting element 140, an optical lens 122 coupled to the mold 130 to cover the light-emitting element 140, and at least two reflective members 110 disposed in the optical lens 120.

Figure 4A:
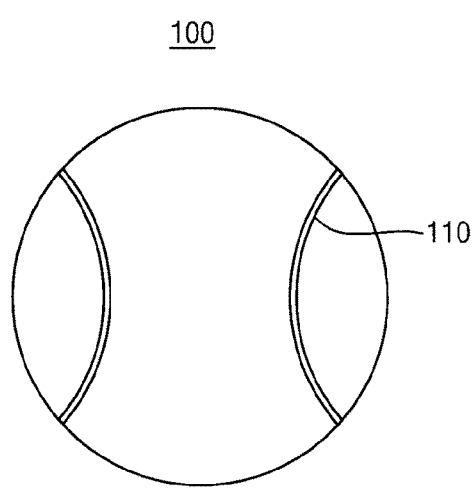
FIGS. 4A to 4D are plan views illustrating various shapes of a reflective member of a point light source according to an exemplary embodiment of the present invention.
Figure 4B:
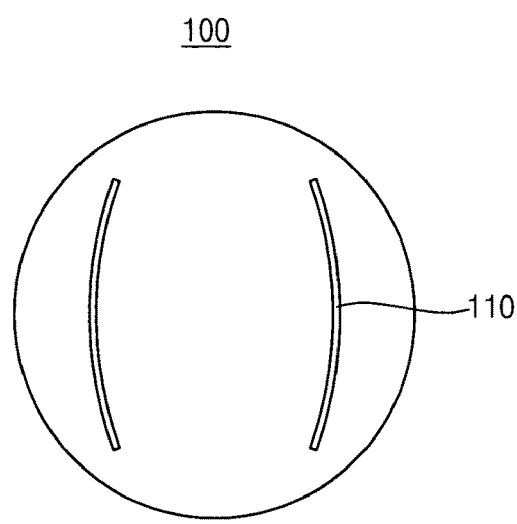
Figure 4C:
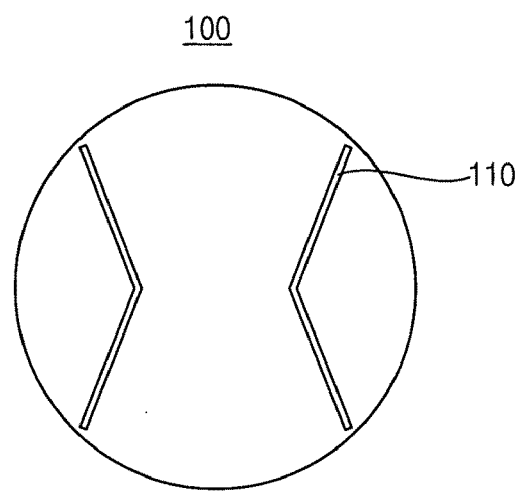
Figure 4D:
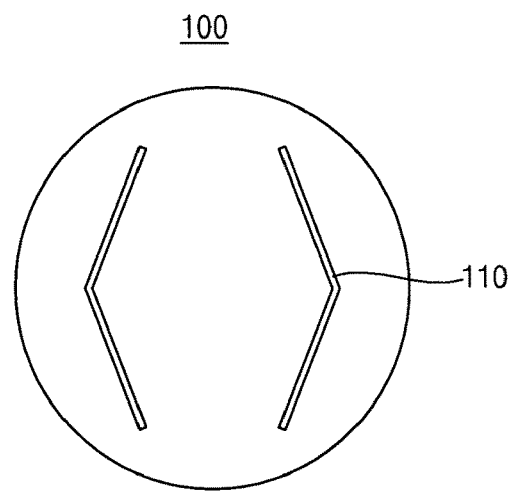

In FIG. 5, the point light source 102 is substantially the same as the point light source 100 illustrated in FIGS. 4A and 4B except for the optical lens 122. Thus, any further description of the point light source 102 will be omitted.

In FIG. 5, a portion of the optical lens 122 corresponding to non-illumination area confined by the two reflective members 110 is omitted. Thus, manufacturing cost of the optical lens 122 may be reduced.

FIGS. 6A to 6D are graphs showing simulation results of luminance distribution of an illumination area related to a distance between the reflective members illustrated in FIGS. 3A and 3B.

Referring to FIGS. 3A, 3B, and 6A to 6D, when the horizontal section diameter 'D' of the optical lens 120 of the point light source 100 is about 6 mm and the distance 'd' between the two reflective members 110 is about 4 mm, about 4.4 mm, about 5 mm and about 6 mm, respectively (with respect to FIGS. 6A to 6D), the simulation results of luminance distribution of the illumination area are shown. A width 'w' of the reflective members 110 is about 3 mm, and a height 'h' of the reflective members 110 is about 2 mm. In FIGS. 6A to 6D, the illumination area includes portions in which a luminance intensity of light that is incident onto a detector is greater than or equal to 10 percent of a luminance intensity of the light axis 'X'. According to the simulation results shown in FIGS. 6A to 6D, when the distance 'd' between the two reflective members 110 increases, the illumination area also increases.

In an exemplary embodiment, a ratio 'w/D' of the width 'w' to the horizontal section diameter 'D' may be in a range of about 0.3 to about 1.2.

FIGS. 7A to 7D are graphs showing simulation results of luminance distribution of an illumination area related to a width of the reflective members illustrated in FIGS. 3A and 3B.

Referring to FIGS. 3A, 3B, and 7A to 7D, when the horizontal section diameter 'D' of the optical lens 120 of the point light source 100 is about 6 mm, the distance 'd' between the two reflective members 110 is about 5 mm, and the width 'w' of the reflective members 110 is about 20 mm, about 40 mm, about 60 mm and about 80 mm, respectively (with respect to FIGS. 7A to 7D), the simulation results of luminance distribution of the illumination area are shown. The height 'h' of the reflective members 110 is about 2 mm. As shown in FIGS. 7A to 7D, when the illumination area includes portions in which a luminance intensity of light that is incident onto a detector is greater than or equal to 10 percent of a luminance intensity of the light axis 'X', the optical lens 120 having the width 'w' of about 20 mm to 80 mm has the illumination area having an approximately linear boundary. To reduce interference with an adjacent point light source, the boundary of the illumination area may preferably be linear. Thus, a ratio 'w/D' of the width 'w' to the horizontal section diameter 'D' of the optical lens 120 may be about 1.0.

In an exemplary embodiment, a ratio of the height 'h' of the reflective members 110 to a radius of curvature at a top point 'P' of the optical lens 120 through which the light axis 'X' passes may be in a range of about 0.2 to about 0.9. For example, the radius of curvature at the top point 'P' of the optical lens 120 is about 4.5 mm.

FIGS. 8A to 8D are graphs showing simulation results of luminance distribution of an illumination area related to a height of the reflective members illustrated in FIGS. 3A and 3B.

Referring to FIGS. 3A, 3B, and 8A to 8D, when the horizontal section diameter 'D' of the optical lens 120 of the point light source 100 is about 6 mm, the distance 'd' between the two reflective members 110 is about 5 mm, and the height 'h' of the reflective members 110 is about 1 mm, about 2 mm, about 3 mm and about 4 mm, respectively (with respect to FIGS. 8A to 8D), the simulation results of luminance distribution of the illumination area are shown. A height 'H' from a lower portion to the top point 'P' of the optical lens 120 through which the light axis 'X' passes is about 2 mm. The width 'w' of the reflective members 110 is about 6 mm. As shown in FIGS. 8A to 8D, when the height 'h' of the reflective members 110 increases, the illumination area decreases. The height 'h' of the reflective members 110 may be determined by a structure of an optical system including the point light source 100.

Figure 8A:
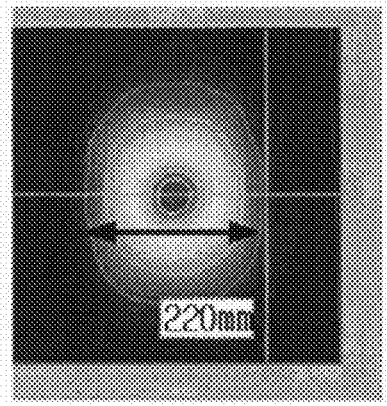
FIGS. 8A to 8D are graphs showing simulation results of luminance distribution of an illumination area related to a height of the reflective members illustrated in FIGS. 3A and 3B.
Figure 8B:
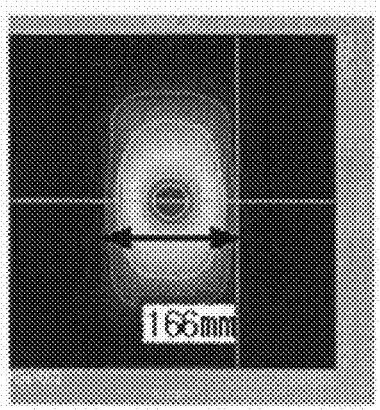
Figure 8C:
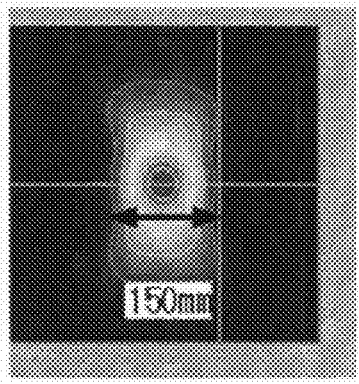
Figure 8D:
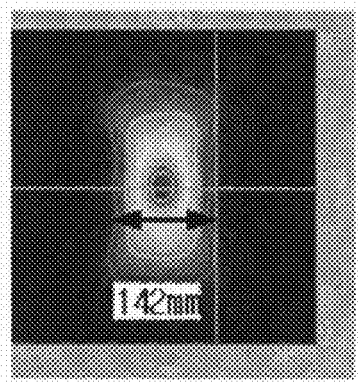
Figure 9A:
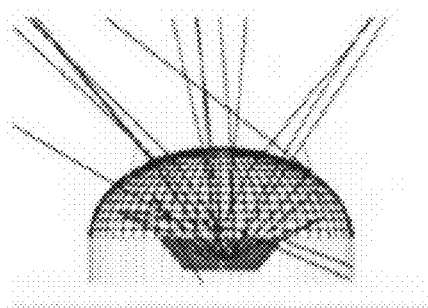
FIGS. 9A to 9H are front views showing simulation results of an optical path related to an inclined angle of the reflective members illustrated in FIGS. 3A and 3B.
Figure 9B:
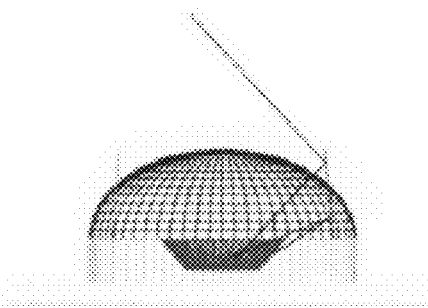
Figure 9C:
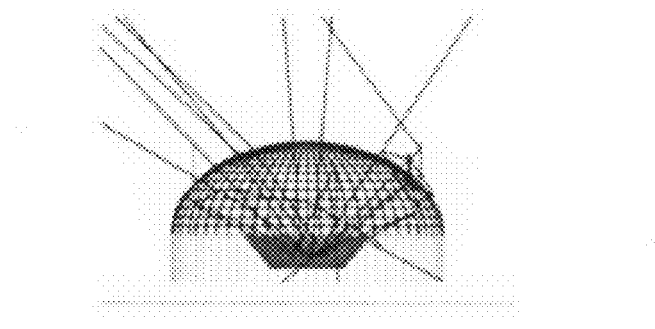
Figure 9D:
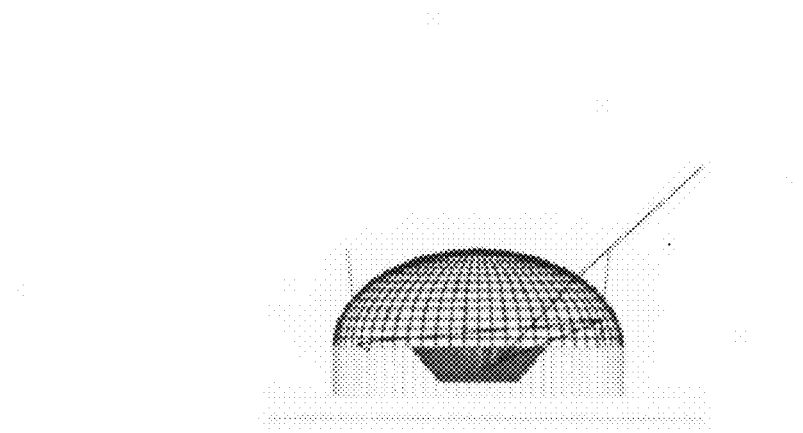
Figure 9E:
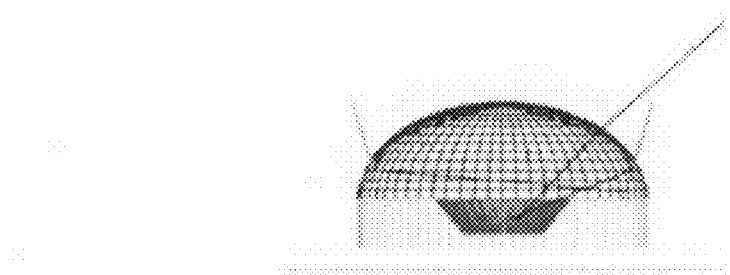
Figure 9F:
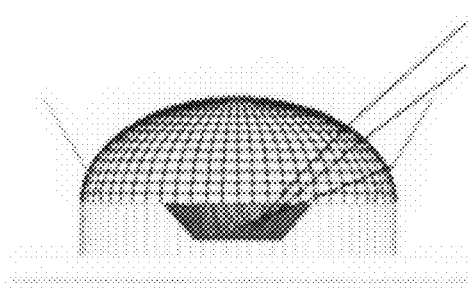
Figure 9G:
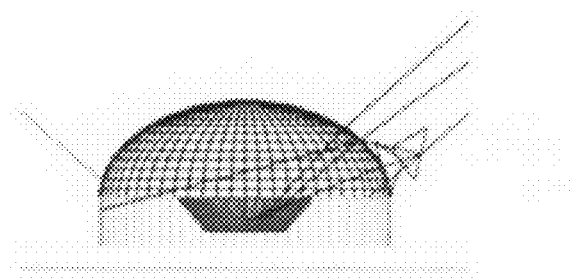
Figure 9H:
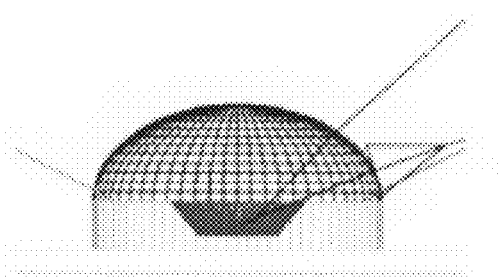
Figure 10A:
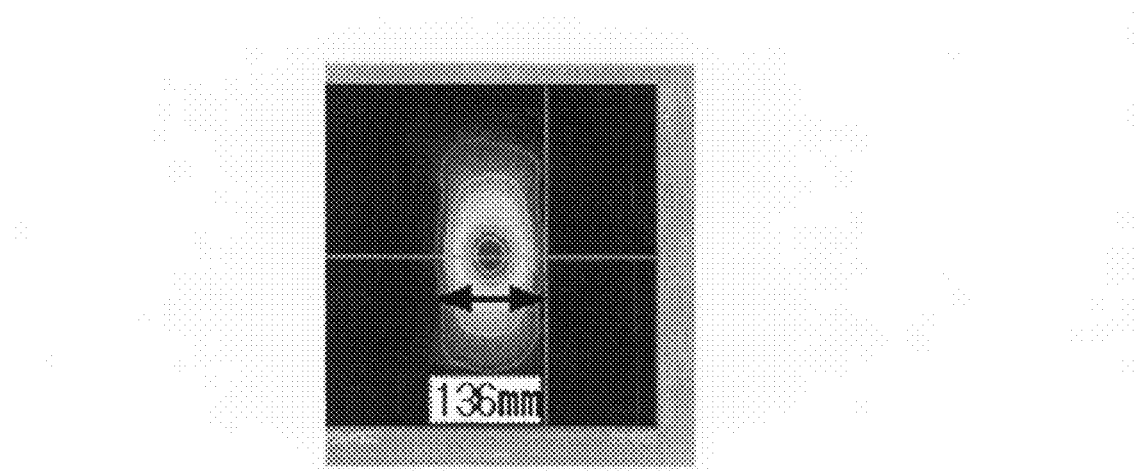
FIGS. 10A to 10H are graphs showing simulation results of luminance distribution of an illumination area related to the inclined angle of the reflective members illustrated in FIGS. 9A to 9H.
Figure 10B:
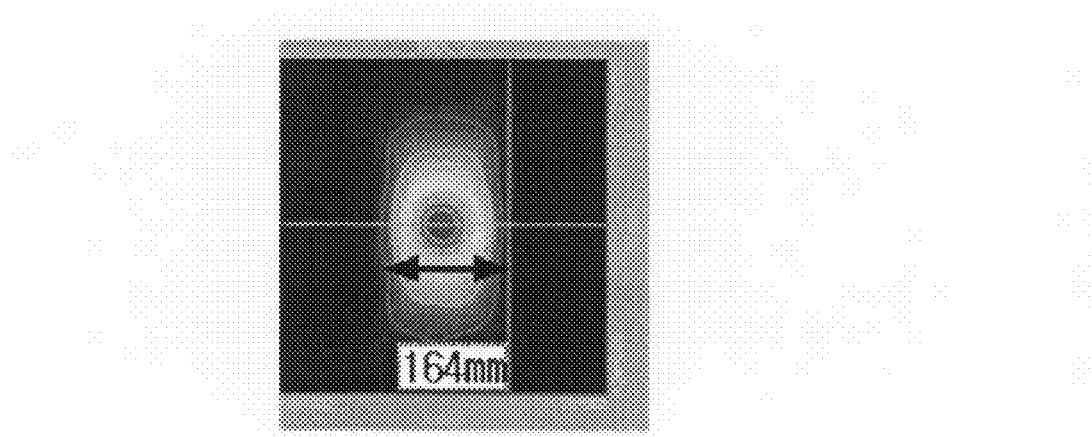
Figure 10C:
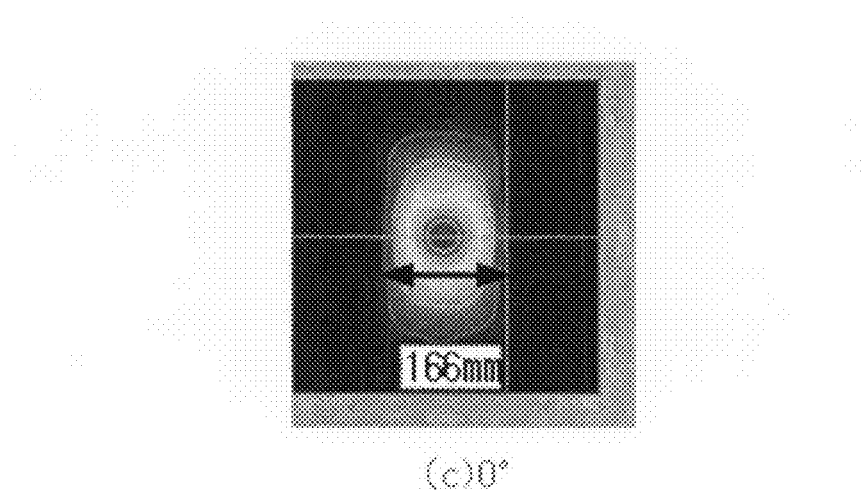
Figure 10D:
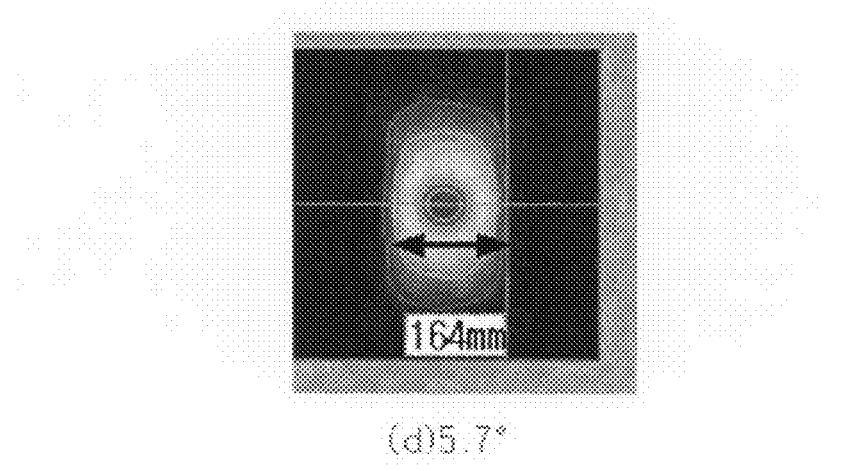
Figure 10E:
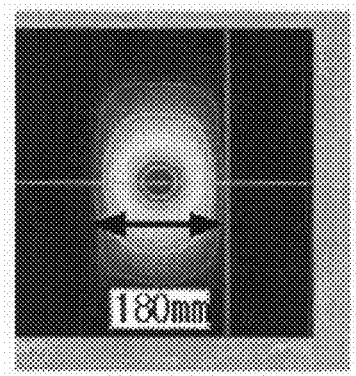
Figure 10F:
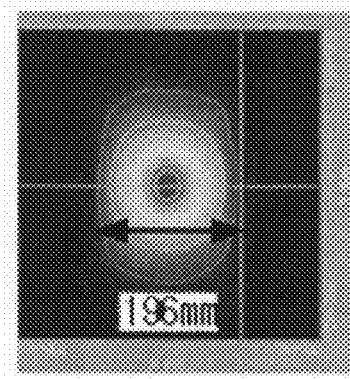
Figure 10G:
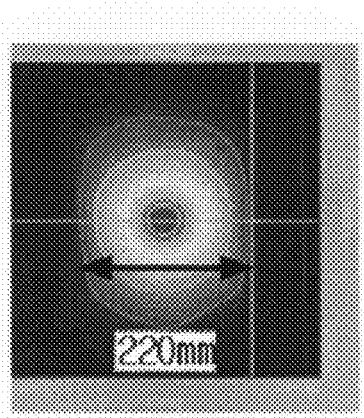
Figure 10H:
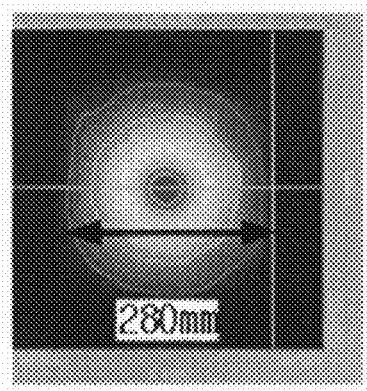

The reflective members 110 may be partially exposed outside the optical lens 120. For example, since the height 'H' from the lower portion to the top point 'P' of the optical lens 120 is about 2 mm, the reflective members 110 in FIGS. 8B to 8D is partially exposed outside the optical lens 120.

Each of the reflective members 110 may have a reflective surface inclined at an angle of about −17 degrees to about 64 degrees with respect to the light axis 'X' of the light-emitting element 140.

FIGS. 9A to 9H are front views showing simulation results of an optical path related to an inclined angle of the reflective members illustrated in FIGS. 3A and 3B. FIGS. 10A to 10H are graphs showing simulation results of luminance distribution of an illumination area related to the inclined angle of the reflective members illustrated in FIGS. 9A to 9H.

Referring to FIGS. 3A, 3B, and 9A through 10H, the horizontal section diameter 'D' of the optical lens 120 of the point light source 100 is about 6 mm, the width 'w' of the reflective members 110 is about 6 mm, and the height 'h' of the reflective members 110 is about 2 mm. As shown in FIGS. 10A to 10H, when the inclined angle of the reflective members 110 is about 60 degrees, the illumination area has a concentric circular shape, and has a similar shape to an illumination area without the reflective members 110. Thus, the inclined angle of the reflective members 110 may preferably be smaller than or equal to about 60 degrees.

According to an embodiment of the present invention, the reflective members confines an optical path of the light emitted from the light-emitting element, thereby preventing the illumination areas of the point light sources from overlapping each other.

In addition, when the point light source having the reflective members serves as a light source of a light receiving type display apparatus using a field sequential driving method, non-uniformity of luminance and color-mixing due to overlap of light sources between fields may be substantially prevented.

Although exemplary embodiments of the present invention have been described, it is understood that the present invention should not be limited to these exemplary embodiments but various changes and modifications can be made by one ordinary skilled in the art within the spirit and scope of the disclosure.

What is claimed is:

1. A point light source comprising:
   a light-emitting element emitting a point light;
   an optical lens disposed over the light-emitting element; and
   at least two reflective members disposed in the optical lens,
   wherein the at least two reflective members are disposed facing each other with respect to a light axis of the light-emitting element.

2. The point light source of claim 1, wherein each of the reflective members has a reflective surface inclined at an angle in a range of about −17 degrees to about 64 degrees with respect to the light axis of the light-emitting element.

3. The point light source of claim 1, wherein the optical lens has a dome shape having a horizontal section of a substantially circular shape.

4. The point light source of claim 3, wherein a ratio of a distance between the at least two reflective members to the horizontal section diameter of the optical lens is in a range of about 0.6 to about 1.0.

5. The point light source of claim 4, wherein the horizontal section diameter of the optical lens is about 6 mm.

6. The point light source of claim 5, wherein the ratio of the distance between the pair of reflective members to the horizontal section diameter of the optical lens is about 0.83.

7. The point light source of claim 3, wherein a ratio of a width of the reflective members to the horizontal section diameter of the optical lens is in a range of about 0.3 to about 1.2.

8. The point light source of claim 7, wherein a ratio of a height of the reflective members to a radius of curvature at a top point of the optical lens through which the light axis of the light-emitting element passes is in a range of about 0.2 to about 0.9.

9. The point light source of claim 8, wherein the radius of curvature at the top point of the optical lens is about 4.5 mm.

10. The point light source of claim 7, wherein at least a portion of the reflective members is exposed outside the optical lens.

11. The point light source of claim 10, wherein a ratio of a height from a lower portion to a top point of the optical lens to a radius of curvature at the top point of the optical lens is in a range of about 0.3 to about 0.7.

12. The point light source of claim 11, wherein the height from the lower portion to the top point of the optical lens is about 2 mm.

13. The point light source of claim 1, further comprising a mold making contact with a lower portion of the optical lens, the mold receiving the light-emitting element in the mold and fastening the light-emitting element to the mold.

14. The point light source of claim 13, wherein the light-emitting element comprises a light-emitting diode (LED).

15. A backlight assembly comprising:
    a plurality of point light sources, each of the point light sources comprising:
        a light-emitting element emitting a point light;
        an optical lens disposed over the light-emitting element; and
        at least two reflective members disposed in the optical lens,
    wherein the at least two reflective members are disposed facing each other with respect to a light axis of the light-emitting element.

16. The backlight assembly of claim 15, wherein the point light sources comprise at least two point light sources having different optical wavelength ranges from each other.

17. The backlight assembly of claim 16, further comprising at least two point light source groups comprising at least one point light source each.

18. The backlight assembly of claim 17, wherein each of the point light source groups comprises at least two point light sources having different optical wavelength ranges.

19. The backlight assembly of claim 18, wherein each of the point light source groups comprises a plurality of point light sources having red, green and blue optical wavelength ranges.

20. A display apparatus comprising:
    a display panel comprising a light receiving type display element; and
    a backlight assembly comprising a plurality of point light sources and providing light from the point light sources to the display panel, each of the point light sources comprising:
        a light-emitting element emitting a point light;
        an optical lens disposed over the light-emitting element; and
        at least two reflective members disposed in the optical lens,
    wherein the at least two reflective members are disposed facing each other with respect to a light axis of the light-emitting element.

21. The display apparatus of claim 20, further comprising at least two point light source groups, each of the at least two point light source groups comprising at least two point light sources having different optical wavelength ranges.

22. The display apparatus of claim 21, wherein each of the point light source groups provides light to a predetermined area of the display panel.

23. The display apparatus of claim 21, wherein each of the point light source groups comprises a plurality of point light sources having red, green and blue optical wavelength ranges.

24. The display apparatus of claim 21, wherein the point light source groups are sequentially turned on and turned off.

25. The display apparatus of claim 23, wherein two point light sources of the same point light source group and having different optical wavelength ranges are non-simultaneously turned on.

* * * * *